United States Patent [19]
Springthorpe et al.

[11] 4,086,126
[45] Apr. 25, 1978

[54] PRODUCTION OF HIGH RADIANCE LIGHT EMITTING DIODES

[75] Inventors: Anthony John Springthorpe, Richmond; Michael John Rider, Kanata, both of Canada

[73] Assignee: Northern Telecom Limited, Montreal, Canada

[21] Appl. No.: 801,106

[22] Filed: May 27, 1977

[51] Int. Cl.² .......................................... H01L 21/306
[52] U.S. Cl. .................................. 156/642; 156/345; 156/640; 156/644; 156/655; 156/659; 156/662; 252/79.5
[58] Field of Search ............... 156/640, 642, 641, 644, 156/650–652, 655, 662, 659, 345; 29/580; 357/15–17, 19; 252/79.5

[56] References Cited

U.S. PATENT DOCUMENTS

| 2,846,346 | 8/1958 | Bradley | 156/640 X |
| 3,981,023 | 9/1976 | King et al. | 357/17 |

FOREIGN PATENT DOCUMENTS 942,135  11/1963  United Kingdom ................ 156/640

Primary Examiner—William A. Powell
Attorney, Agent, or Firm—Sidney T. Jelly

[57] ABSTRACT

For aligning holes in substrates with the light emitting regions of light emitting diodes, particularly Burrus type diodes, an etchant based on an alkaline peroxide solution is ejected or sprayed onto the masked surface of the substrate. The etchant is selective and also avoids production of insoluble oxides in partially etched holes, as often happens in conventional processes. The invention is particularly applicable to producing holes through substrates to align optical fibres with the light emitting regions.

12 Claims, 3 Drawing Figures

PRODUCTION OF HIGH RADIANCE LIGHT EMITTING DIODES

This invention relates to the production of high radiance light emitting diodes, and in particular to the production of such diodes having holes etched through the substrate to the light emitting region.

High radiance light emitting diodes, hereinafter referred to as LED's, are used extensively in fibre optic communications systems. The type of LED generally used is often referred to as a Burrus LED, such as described by C. A. Burrus and B. I. Miller, Optical Communications, 4, page 307, (1971), and usually comprises a semiconductor substrate on which are sequentially formed a first confining layer, an active layer and a further confining layer. There may be a capping layer on the first confining layer. Typically, the substrate is of gallium arsenide (GaAs) and the first confining layer is of gallium aluminum arsenide $Ga_{(1-x)}Al_xAs$, where $x>0.2$). The active layer and further confining layer are also of $Ga_{(1-x)}Al_xAs$ suitably doped to provide the correct relative conductivity types.

A hole is etched through the substrate to the interface between substrate and first confining layer, to permit of efficient emission of light, since absorption in the substrate is generally high while the absorption in the confining layer is negligible. The hole also serves to align an optical fibre with the light emitting region in the active layer. Difficulty has been experienced with satisfactory etching of the holes. A selective etch is used and this selectivity can depend on particular etch solutions, temperature and so on. From time to time, without any apparent detectable reason, insoluble oxide films form at the base of the holes preventing complete etching. High concentrations of etch solution can be a partial answer, but the selectivity is reduced and some etching of the confining layer can occur.

The present invention is concerned with a particular method of etching the holes and with preferred solutions for use in such method. Particularly, the invention provides for ejecting the etch solution on to the surface of the substrate, the etch solution being an alkaline peroxide solution. Examples of alkaline peroxide solution are hydrogen peroxide with either sodium hydroxide, potassium hydroxide or ammonium hydroxide. The alkaline component, in solution form, is added to the hydrogen peroxide to give the desired pH value, which typically can be between 7.5 and 8.5.

The invention will be readily understood by the following description of one method, by way of example, in conjunction with the accompanying drawings, in which.

Figure 1:
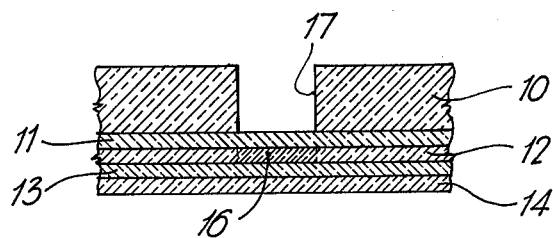
FIG. 1 is a cross-section through a typical LED as produced by the present invention.

Considering first FIG. 1, an LED structure comprises a semiconductor substrate 10 on which are sequentially formed a first confining layer 11, an active layer 12 and a second confining layer 13. A capping layer 14 can also be provided. A typical material for the substrate is undoped GaAs, the layers 11, 12 and 13 being of GaAlAs, doped such that the conductivity types of the layers and substrate is such as to produce a pn junction between the active layer and one of the confining layers. Thus, for example, the substrate 10 is of n-type, first confining layer 11 n-type, active layer 12 of p or n-type and the second confining layer of p-type. Layer 14 would be of p-type GaAs, but could also be of $Ga_{(1-y)}Al_yAs$, where $y<<x$ is generally about 0.05. The layers can be expiditiously formed by epitaxial growth, in a known manner.

When suitable contacts are applied to a structure, a light emitting region is formed at 16 on application of the correct bias. A hole 17 is etched through the substrate 10, the hole 17 and the region 16 being aligned. An optical fibre, not shown, can be accurately aligned with the region 16 by being inserted in the hole 17.

It will be appreciated that is is necessary, for effective and efficient light emission, that the substrate must be clearly and completely etched away at the hole, but substantially no etching of the first confining layer 11 should occur.

Typical etching solutions previously used are based on the mixture of 30% $H_2O_2$ and 0.88 $NH_4OH$ with compositions in the range of 3 to 7% by volume of $NH_4OH$. Such solutions are partially selective for GaAs and stop at the interface between the substrate and the first confining layer. The selectivity of these solutions is less marked at the higher $NH_4OH$ concentrations and some attack of the first confining layer can happen. However, such higher concentrations have been used in an attempt to overcome the aforementioned difficulties with the formation of insoluble oxide films when using the lower concentrations. The problem is accentuated when the hole depth is greater than 50μm, and to counter this effect the slice thickness has been reduced to be in the range of 50–70μm. However, at this thickness breakage frequently occurs and is a factor in reducing process yield.

For efficient and economic production, many devices are made from one substrate wafer, and thus many holes are required in each substrate. Consistent and uniform etch rate is desirable to ensure that all the holes are etched to the substrate — confining layer interface, with minimal etching of the confining layer.

In accordance with the present invention, an alkaline peroxide solution, for example a sodium hydroxide solution, is used. Even with strong illumination and magnetic stirring it was still found that satisfactory etching was not obtained with this solution. Ultrasonic agitation also did not produce satisfactory results. However, by ejecting the solution onto the wafer, satisfactory etching was obtained.

Figure 2:
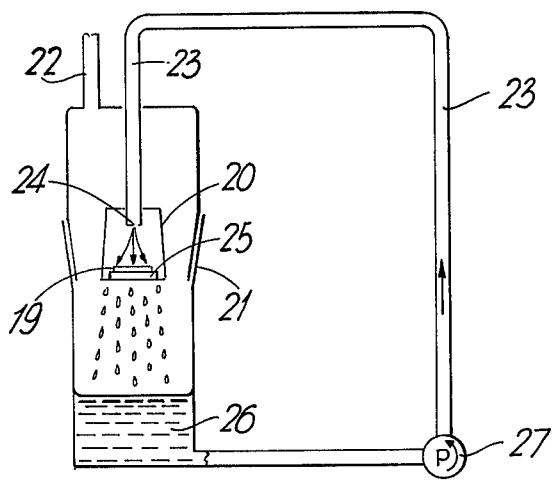
FIG. 2 is a diagrammatic illustration of one form of apparatus for carrying out the method.

FIG. 2 illustrates diagrammatically one form of apparatus for carrying out the invention. The wafer 19, comprising a substrate 10 and layers 11, 12, 13 and 14 if provided, is held in a basket 20 in a two part flask or similar 21. The top part of the flask has a vent 22 and tubing 23 enters through the top part and has its outlet end 24 positioned directly over the wafer 10. The wafer is supported on a silica plate 25, with the substrate uppermost, the substrate masked, as by photolithography, to define the positions at which holes are to be etched.

The etching solution is circulated from a reservoir 26 in the bottom part of the flask via a pump 27, for example a peristaltic pump, through the tubing 23. A typical flow rate is approximately 1 liter a minute with an approximate velocity of 1 meter/xec. To improve the distribution of the etchant solution over the surface of the substrate, a nozzle can be positioned in the outlet end 24 to give a swirl to the solution as its exits. This produces a wider jet of solution, more evenly distributed over the surface of the substrate, and gives uniform etching for all the holes. With a flow perpendicular to the substrate surface, as occurs without swirl, it has been found that "shadowing" can occur for some of the holes near the periphery of a substrate, with etching not being completely uniform. The solution impinges on the surface of the substrate. With this method, and a solution composed of 100 ml $H_2O_2$ + 43 ml 0.5N-NaOH (pH≅8.40) a high etch rate was obtained — as high as a factor of 4 over the magnetically stirred system. All the holes were found to be cleanly etched out, there was no insoluble oxide and no significant etching of the confining layer, even after prolonged exposure to the solution.

Yields of up to 100% have been obtained and even in bad cases, yields of over 80% have been obtained. The etch rate was found to be uniform over the whole wafer and indpendent of the jet impingement angle and position. Deeper holes can be etched with less undercutting — for example holes 90μm have been etched. The lack of significant etching of the confining layer also provides for effective etching of tapered wafers. With such wafers it will be apparent that the depths of holes to be etched through the substrate will vary across the substrate. Entire etching time over that necessary for the shallowest holes is required to completely etch the deeper holes, and this is possible without significantly etching the confining layer at the base of the shallower holes.

The yield and uniformity is improved and thicker crystals or wafers can be used, reducing the possibility of breakage.

Conveniently, etching is carried out at approximately 25° C. At lower temperatures the etch rate is decreased and at higher temperatures etch rate is increased. There is also a possibility that the selectivity will be affected at higher temperatures. It is considered that temperatures up to about 50° C are acceptable.

Figure 3:
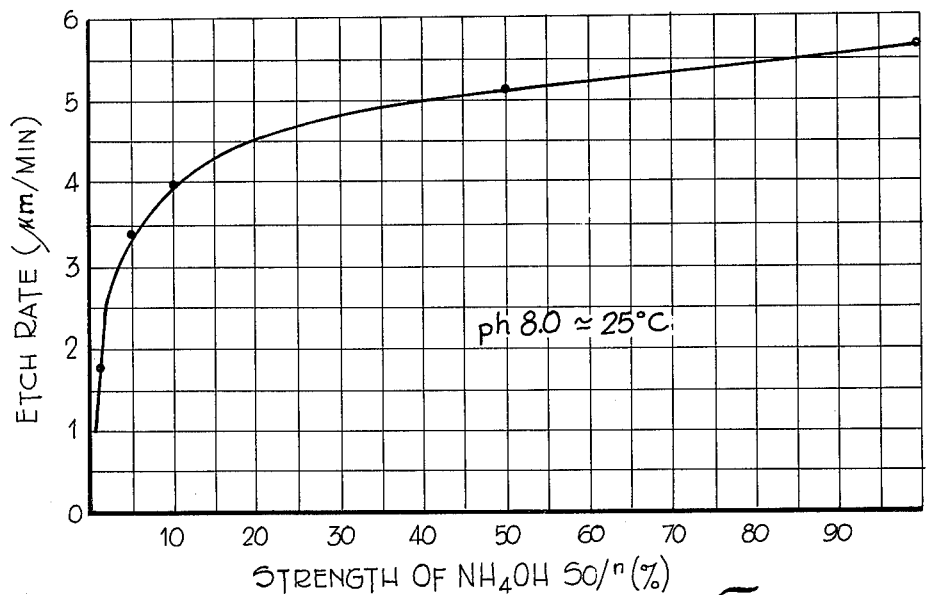
FIG. 3 is a curve illustrating the relationships between the strength of the alkali solution, $NH_4OH$, used to make the etch solution and the etch rate.

Etch rate also varies with pH, increasing with increase in pH and decreasing with decrease in pH. Etch rate is also dependent on the strength of the alkali solution used to make up etch solution. FIG. 3 illustrates the effect of $NH_4OH$ solution strength at a pH of 8.0. The pH value can be increased above 8.0, but above a pH value of 8.6 significant affects on selectivity have been observed. It is preferred that a maximum pH value of 8.5 be used, while a value between about 8.0 to 8.4 gives a good compromise between good etch rate and very good selectivity, although pH values down to 7.5 have been used.

The strength of the alkaline solution added to the hydrogen peroxide can vary. Thus, for example, sodium hydroxide solutions of from 10N to .1N have been used.

What is claimed is:

1. For a light emitting diode comprising a GaAs substrate and layers of differentially doped GaAlAs forming sequentially a first confining layer, an active layer and a second confining layer, to produce a p-n junction between said active layer and one of said confining layers, a method of selectively etching at least one hole through said substrate to said first confining layer, comprising ejecting an etchant based on an alkaline peroxide solution onto a masked surface of said substrate.

2. The method of claim 1, the pH of the etchant being a maximum of about 8.6.

3. The method of claim 2, the pH of the etchant between about 7.6 and 8.4.

4. The method of claim 1, the etchant circulated from a reservoir, through a pump and tubing to eject on said substrate, the etchant draining back to said reservoir.

5. The method of claim 1, the etchant at a temperature of not more than 50° C.

6. The method of claim 5, the etchant at a temperature of about 25° C.

7. The method of claim 1, the etchant having an ejection velocity of about 1 meter/sec.

8. The method of claim 4, the etchant having a flow rate of about 1 liter per minute.

9. The method of claim 1, including ejecting the etchant through a nozzle, the nozzle imparting a swirl to the etchant.

10. The method of claim 1, the etchant being a hydrogen peroxide/sodium hydroxide solution.

11. The method of claim 1, the etchant being a hydrogen peroxide/potassium hydroxide solution.

12. The method of claim 1, the etchant being a hydrogen peroxide/ammonium hydroxide solution.

* * * * *